United States Patent
Lin et al.

(10) Patent No.: US 8,571,472 B2
(45) Date of Patent: Oct. 29, 2013

(54) PROXIMITY SENSOR MODULE AND ELECTRONIC DEVICE USING SAME

(75) Inventors: Ming-Chih Lin, Tu-Cheng (TW); Chen-Fa Ting, Tu-Cheng (TW); Chien-Yao Chao, Tu-Cheng (TW)

(73) Assignee: Chi Mei Communication Systems, Inc., New Taipei (TW)

( * ) Notice: Subject to any disclaimer, the term of this patent is extended or adjusted under 35 U.S.C. 154(b) by 206 days.

(21) Appl. No.: 13/155,322

(22) Filed: Jun. 7, 2011

(65) Prior Publication Data
US 2012/0164962 A1    Jun. 28, 2012

(30) Foreign Application Priority Data
Dec. 28, 2010   (TW) ................................ 99146341 A

(51) Int. Cl.
*H04B 1/04* (2006.01)
(52) U.S. Cl.
USPC ........................ 455/41.1; 455/575.1; 455/129

(58) Field of Classification Search
USPC ......... 455/41.1, 41.2, 456.1, 550.1, 566, 567, 455/572, 575.1–575.7, 91, 127.1, 128, 129
See application file for complete search history.

(56) References Cited

U.S. PATENT DOCUMENTS

| | | | |
|---|---|---|---|
| 8,326,385 B2 * | 12/2012 | Brogle et al. | 455/575.7 |
| 2011/0105023 A1 * | 5/2011 | Scheer et al. | 455/41.2 |
| 2011/0207508 A1 * | 8/2011 | Takahashi et al. | 455/572 |

* cited by examiner

*Primary Examiner* — Thanh Le
(74) *Attorney, Agent, or Firm* — Altis & Wispro Law Group, Inc.

(57) ABSTRACT

A proximity sensor module used in an electronic device includes a combination sensing element and antenna, and a detecting circuit electrically connected to the combination sensing element and antenna. The combination sensing element and antenna is used to detect whether an external object is in vicinity of the combination sensing element and antenna according to capacitance changes of the combination sensing element and antenna in presence or absence of an external object in the vicinity, the detecting circuit detects the capacitance changes, and generates a signal associated with the changes to decrease or increase transmission power transmitted to the combination sensing element and antenna.

9 Claims, 1 Drawing Sheet

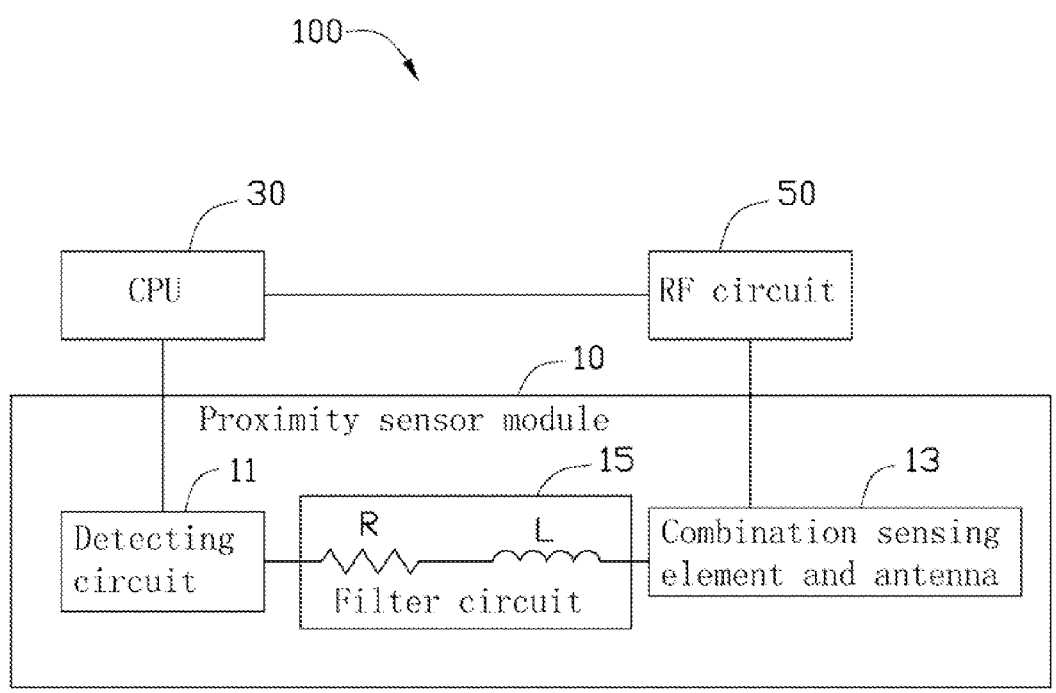

PROXIMITY SENSOR MODULE AND ELECTRONIC DEVICE USING SAME

BACKGROUND

1. Technical Field

The disclosure generally relates to proximity sensor modules, particularly to a capacitive proximity sensor module and an electronic device using the capacitive proximity sensor module.

2. Description of Related Art

Proximity sensors are built into many electronic devices (e.g., tablet computers) to detect when an external object, such as a human body part, comes within a given distance of the electronic device. When the presence of an external object in a vicinity of the electronic device is detected, a transmit power of an antenna of the electronic device may be reduced to ensure that radiation transmission levels are sufficiently low to meet regulatory limits for specific absorption rate (SAR). When the external object is no longer present, transmit power of the antenna may be increased. Generally, a typical capacitive proximity sensor includes a detecting circuit and a sensing element which can be a sensing capacitor or a group of sensing capacitors. Capacitance of the sensing element changes according to the presence or absence of the conductive or the dielectric object in the vicinity of the sensing element. The detecting circuit detects capacitance changes of the conductive or the dielectric object, and transmits signals accordingly.

A typical sensing element of the capacitive proximity sensor is made of copper and formed on a printed circuit board (PCB) of the electronic device. However, the sensing element occupies area of the PCB which causes an increase in overall volume of the electronic device.

Therefore, there is room for improvement within the art.

BRIEF DESCRIPTION OF THE DRAWING

Many aspects of the proximity sensor module and the electronic device using the proximity sensor module can be better understood with reference to the following drawing. The components in the drawing are not necessarily drawn to scale, the emphasis instead being placed upon clearly illustrating the principles of the proximity sensor module and the electronic device using the proximity sensor module.

The FIGURE is a schematic block diagram of an exemplary electronic device using an exemplary proximity sensor module.

DETAILED DESCRIPTION

The FIGURE shows an electronic device 100 having a proximity sensor module 10, according to an embodiment. The device 100 can be a notebook computer, a tablet computer, or a mobile phone, for example. The device 100 further includes a CPU 30, a radio frequency (RF) circuit 50. The CPU 30 is electrically connected to the sensor module 10 and the RF circuit 50. The sensor module 10 is used to detect when an external object, such as a human body part, a conductive, and/or a dielectric object, comes within a given distance of the device 100. When the presence of an external object in the vicinity of the electronic device is detected by the sensor module 10, the sensor module 10 generates a signal to the CPU 30 which reduces transmitting power of the RF circuit 50 accordingly.

The sensor module 10 includes a detecting circuit 11, combination sensing element and antenna 13, and a filter circuit 15. The detecting circuit 11 is electrically connected to the combination sensing element and antenna 13 via the filter circuit 15 and is also electrically connected to the CPU 30. In the present disclosure, the combination sensing element and antenna 13 works as both the antenna and the sensing element. The combination sensing element and antenna 13 is electrically connected to the RF circuit 50 to receive and transmit RF signals. The combination sensing element and antenna 13 is also used to detect whether an external object is in the vicinity according to capacitance changes of the combination sensing element and antenna 13 in the presence or absence of an external object in the vicinity. The combination sensing element and antenna 13 includes a radiation body which is made of metal, such as copper or iron. The detecting circuit 11 detects capacitance changes of the combination sensing element and antenna 13, and generates a signal associated with the changes to the CPU 30. The CPU 30 decreases or increases transmission power of the RF circuit 50 to the combination sensing element and antenna 13 according to the signal. Specifically, a lower transmission power and a higher transmission power of the RF circuit 50 is transmitted to the combination sensing element and antenna 13 when the detected external object moves closer to and moves away from, respectively, from the combination sensing element and antenna 13. In other words, power is not only adjusted according to the presence of a detected object, but the degree of adjustment can vary according to varying distance between the detected object and the device 100.

The filter circuit 15 is used to reduce noise induced between the detecting circuit 11 and the combination sensing element and antenna 13 to support radiation efficiency of the combination sensing element and antenna 13. The filter circuit 15 is an RL filter which includes a resistor R and an inductor L connected in series, according to the exemplary embodiment. The resistor R has a terminal electrically connected to the detecting circuit 11, and the inductor L has a terminal electrically connected to the combination sensing element and antenna 13.

The proximity sensor module 10 uses the combination sensing element and antenna 13 of the electronic device 100 to work as a sensing element. Therefore, an additional component is not needed in the electronic device 100, and the volume of the PCB and the electronic device 100 is relatively decreased.

It is believed that the exemplary embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A proximity sensor module, used in an electronic device comprising:

a combination sensing element and antenna, working as both an antenna and a sensing element, used to detect whether an external object is in vicinity of the combination sensing element and antenna according to capacitance changes of the combination sensing element and antenna in the presence or absence of an external object in the vicinity;

a detecting circuit, electrically connected to the combination sensing element and antenna, that detects the capacitance changes, and generates a signal associated with the changes to decrease or increase transmission power transmitted to the combination sensing element and antenna; and a filter circuit electrically connected between the detecting circuit and the combination sensing element and antenna to reduce noise induced between the detecting circuit and the combination sensing element and antenna.

2. The proximity sensor module as claimed in claim 1, wherein a lower transmission power and a higher transmission power is transmitted to the combination sensing element and antenna when the detected external object moves closer to and moves away from, respectively, from the combination sensing element and antenna.

3. The proximity sensor module as claimed in claim 1, wherein the filter circuit is an RL filter circuit which includes a resistor and an inductor connected in series, the resistor has a terminal electrically connected to the detecting circuit, and the inductor has a terminal electrically connected to the combination antenna sensing element.

4. The proximity sensor module as claimed in claim 1, wherein the combination sensing element and antenna has a radiation body made of one of copper and iron.

5. An electronic device, comprising:
   a CPU;
   a radio frequency (RF) circuit;
   a proximity sensor module comprising:
      a combination sensing element and antenna, electrically connected to the RF circuit, working as both an antenna and a sensing element, used to detect whether an external object is in vicinity of the combination sensing element and antenna according to capacitance changes of the combination sensing element and antenna in presence or absence of the external object in the vicinity;
      a detecting circuit, electrically connected to the combination sensing element and antenna and the CPU, detecting the capacitance changes, and generating a signal associated with the changes to the CPU, the CPU decreasing or increasing transmission power of the RF circuit transmitted to the combination sensing element and antenna according to the signal; and
      a filter circuit, wherein the filter circuit is electrically connected between the detecting circuit and the combination sensing element and antenna to reduce noise induced between the detecting circuit and the combination sensing element and antenna.

6. The electronic device as claimed in claim 5, wherein a lower transmission power and a higher transmission power is transmitted to the combination sensing element and antenna when the detected external object moves closer to and moves away from, respectively, from the combination sensing element and antenna.

7. The electronic device as claimed in claim 5, wherein the filter circuit is an RL filter circuit which includes a resistor and an inductor connected in series, the resistor has a terminal electrically connected to the detecting circuit, and the inductor has a terminal electrically connected to the combination antenna sensing element.

8. The electronic device as claimed in claim 5, wherein the combination sensing element and antenna has a radiation body made of one of copper and iron.

9. The electronic device as claimed in claim 5, wherein the electronic device is a notebook computer or a tablet personal computer.

\* \* \* \* \*